United States Patent
Chou et al.

(10) Patent No.: US 7,817,265 B2
(45) Date of Patent: Oct. 19, 2010

(54) ALIGNMENT MARK AND DEFECT INSPECTION METHOD

(75) Inventors: Ling-Chun Chou, Yunlin County (TW); Ming-Tsung Chen, Hsin-Chu Hsien (TW); Hsi-Hua Liu, Taipei (TW); Shuen-Cheng Lei, Tainan County (TW); Po-Chao Tsao, Taipei Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 176 days.

(21) Appl. No.: 12/237,404

(22) Filed: Sep. 25, 2008

(65) Prior Publication Data

US 2010/0073671 A1 Mar. 25, 2010

(51) Int. Cl.
*G01N 21/00* (2006.01)
(52) U.S. Cl. .................. 356/237.5; 438/16; 430/30
(58) Field of Classification Search ... 356/237.1–237.5, 356/399–400; 438/7, 14, 16; 430/30
See application file for complete search history.

(56) References Cited

U.S. PATENT DOCUMENTS

| 7,728,969 | B2 * | 6/2010 | Saito et al. ............... 356/237.5 |
| 2002/0142496 | A1 * | 10/2002 | Nakasuji et al. ............... 438/14 |
| 2003/0224262 | A1 * | 12/2003 | Lof et al. ...................... 430/22 |
| 2007/0023658 | A1 * | 2/2007 | Nozoe et al. ................. 250/310 |
| 2009/0050822 | A1 * | 2/2009 | Nakasuji et al. .......... 250/492.2 |

* cited by examiner

*Primary Examiner*—Hoa Q Pham
(74) *Attorney, Agent, or Firm*—Winston Hsu; Scott Margo; Min-Lee Teng

(57) ABSTRACT

A defect inspection method is disclosed. A first type defect inspection system is used to perform a first defect inspection by aligning to an alignment mark on a wafer as a reference point for the first defect inspection. A fabrication process is performed on the wafer thereafter, and a second defect inspection is performed by using a second type defect inspection system to align the alignment mark on the wafer as the reference point for the second defect inspection.

10 Claims, 3 Drawing Sheets

ALIGNMENT MARK AND DEFECT INSPECTION METHOD

BACKGROUND OF THE INVENTION

1. Field of the Invention

The invention relates to an alignment mark, and more particularly, to an alignment mark fabricated by ion implantation processes and defect inspection for using the alignment mark.

2. Description of the Prior Art

Semiconductor integrated circuits undergo a variety of processing steps during manufacture, such as masking, resist coating, etching, and deposition. In many of these steps, material is overlaid or removed from the existing layer at specific locations in order to form the desired elements of the integrated circuit. Proper alignment of the various process layers is therefore critical.

Registration is typically used to measure layer-to-layer alignment accuracy for a semiconductor process. Registration involves comparing a position of a subsequent layer to a position of an existing layer by overlaying a distinct pattern on a matching pattern that is previously formed on the existing layer. At least an alignment mark is formed in the distinct pattern and the matching pattern. A distance between the alignment mark in the subsequent layer and the alignment mark in the existing layer provides a measure of misalignment between these two layers. Currently available registration structures include Box-in-Box visual verniers and Bar-in-Bar visual verniers to determine the extent of registration, i.e., the amount of alignment offset.

However, with the shrinking dimensions of modern integrated circuits, multi-layer structure is developed for a chip. For a three-layer structure or a more complicated structure, a plurality of layer-to-layer alignment and defect inspection is commonly performed. For instance, an optical defect inspection is performed on the wafer, and an electrical defect inspection is performed thereafter. Results from the defect inspection are then examined and compared according to defect map generated during the defect inspection. However, as different types of defect inspection use different coordinates, offset issue often arise from the values generated from the defect inspection and result in poor overlap sensitivity from layer-to-layer.

SUMMARY OF THE INVENTION

It is an objective of the present invention to provide an alignment mark and a defect inspection method for utilizing this alignment mark for improving alignment offset issue during a defect inspection.

The defect inspection method of the present invention preferably includes the steps of: performing a first defect inspection by a first type defect inspection system by aligning to an alignment mark on a wafer as a reference point for the first defect inspection; performing at least one fabrication process to the wafer; and performing a second defect inspection by a second type defect inspection system by aligning to the alignment mark on the wafer as a reference point for the second defect inspection.

Another aspect of the present invention discloses an alignment mark for defect inspection. The alignment mark includes: a semiconductor substrate; a first type well disposed in the semiconductor substrate; a second type doping region disposed in the first type well; a dielectric layer disposed on the semiconductor substrate to cover the first type well and the second type doping region; and a plurality of conductive plugs formed in the dielectric layer for connecting to the second type doping region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
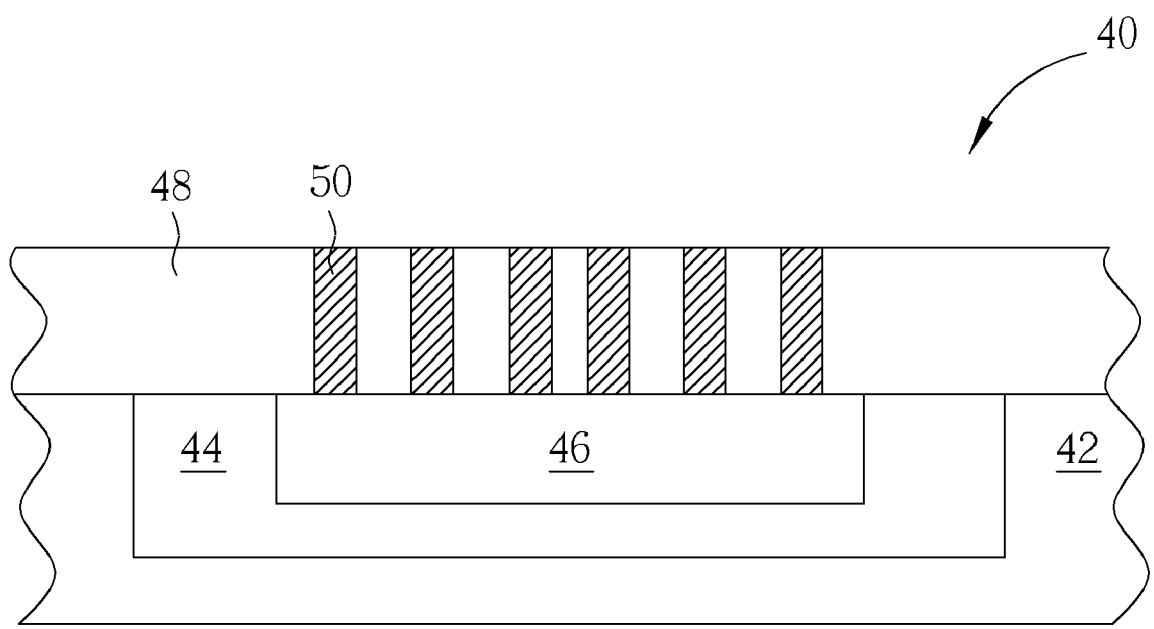
FIG. 1 illustrates a cross-sectional view of an alignment mark according to a preferred embodiment of the present invention.
Figure 2:
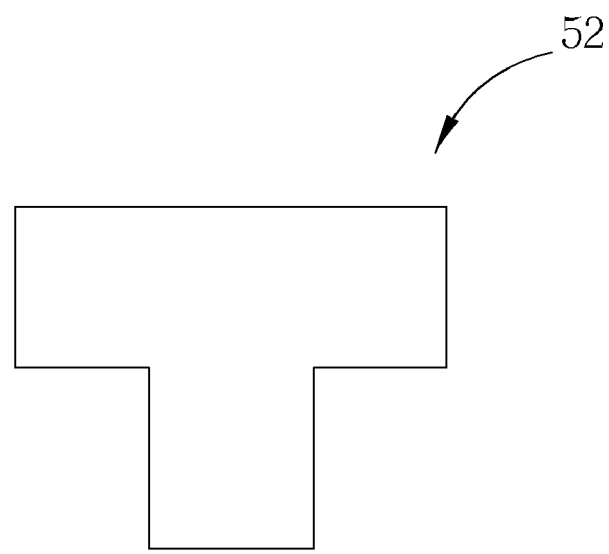
FIG. 2 illustrates a top view of a T-shaped alignment mark according to an embodiment of the present invention.
Figure 3:
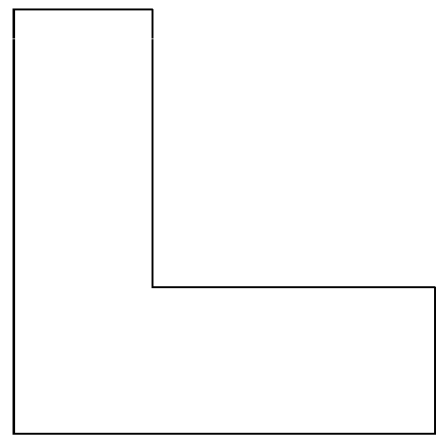
FIG. 3 illustrates a top view of a L-shaped alignment mark according to an embodiment of the present invention.
Figure 4:
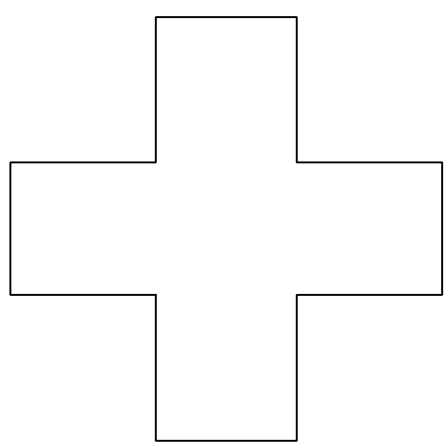
FIG. 4 illustrates a top view of a cross-shaped alignment mark according to an embodiment of the present invention.
Figure 5:
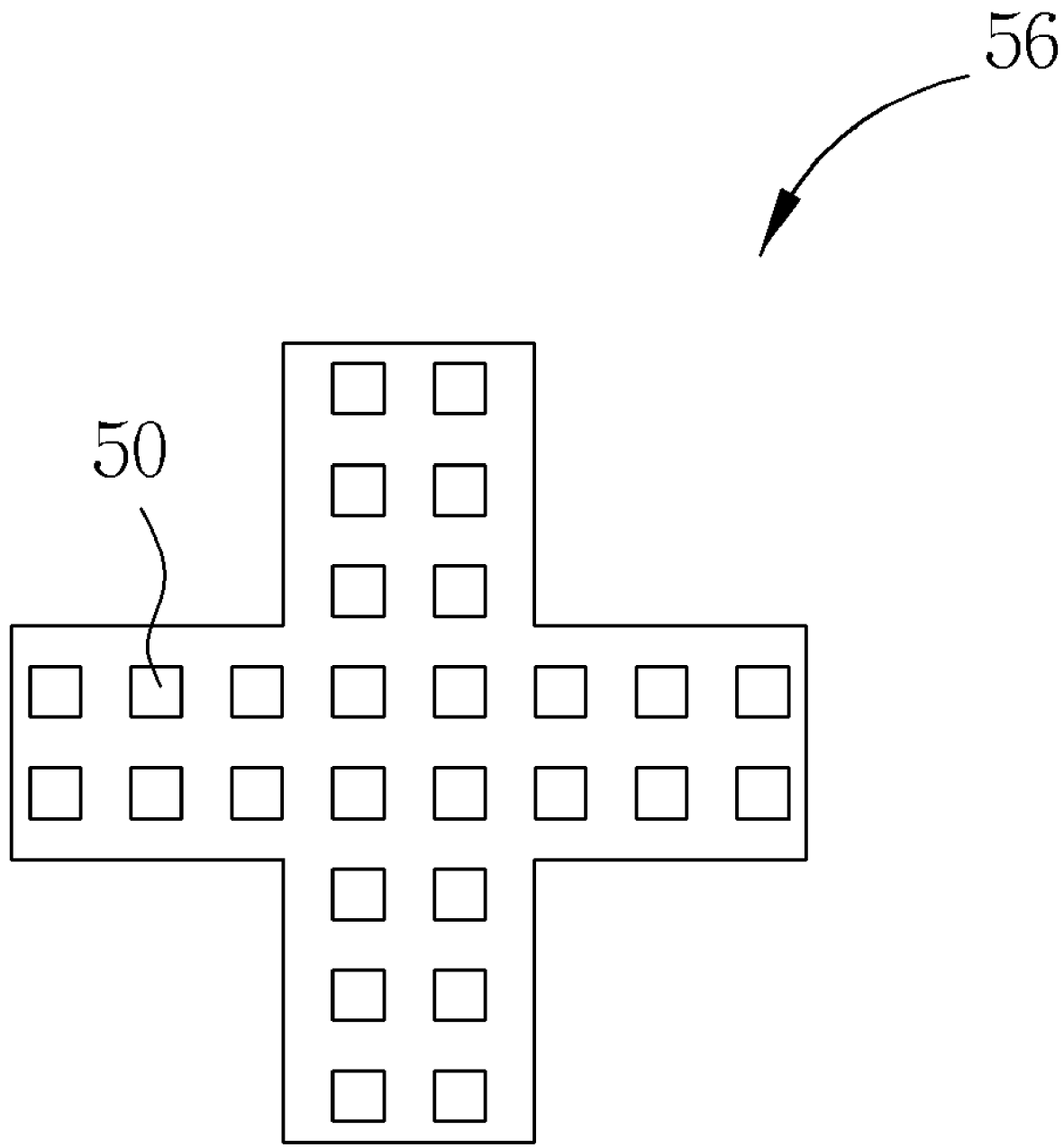
FIG. 5 illustrates a top view of a cross-shaped alignment mark showing array of contact plugs according to an embodiment of the present invention.

Referring to FIG. 1, FIG. 1 illustrates a cross-sectional view of an alignment mark 40 according to a preferred embodiment of the present invention. As shown in FIG. 1, a semiconductor substrate 42, such as a silicon wafer is provided. An ion implantation process is performed by implanting n-type dopants into the semiconductor substrate 42 to form a n– well 44. Another ion implantation process is followed thereafter to implant p-type dopants into the n– well 44 for forming a p+ doping region 46 with shallower depth.

A dielectric layer 48 is formed on the semiconductor substrate 42 to cover the n– well 44 and the p+ doping region 46. In this embodiment, the dielectric layer 48 is preferably composed of dielectric material such as oxides, carbides, nitrides, low-k dielectric material, or combination thereof. A patterned photoresist (not shown) is then formed on the dielectric layer 48, and an etching process is conducted thereafter by using this patterned photoresist as mask to form a plurality of contact holes (not shown) in the dielectric layer 48, in which the contact holes preferably exposes the surface of the p+ doping region 46. Next, a sputtering or electroplating process is performed to deposit at least one metal into each contact hole to form a plurality of contact plugs 50. Preferably, the contact plugs are composed of conductive material such as titanium, titanium nitride, tungsten, tantalum, tantalum nitride, aluminum, copper, or combination thereof. This completes the fabrication of an alignment mark 40. Preferably, the metal interconnects disposed above the contact plugs 50, including the first metal layer (not shown), the first via hole (not shown), the second metal layer (not shown), and the second via hole (not shown) could all be used for fabricating required patterns. For instance, the first metal layer could be fabricated into the pattern of alignment mark, and the first via hole could be the array of the contact plug 50, which are all within the scope of the present invention.

It should be noted that the alignment mark 40 is specifically formed in combination with a typical semiconductor transistor fabrication process. For instance, the n– well 44 of the alignment mark 40 could be fabricated at the same time as the n– well of a PMOS transistor, and the p+ doping region 46 of the alignment mark 40 could be fabricated at the same time as the source/drain region of the PMOS transistor is formed.

Thereafter, a portion of the polysilicon layer disposed in the alignment mark region is etched away while the gate structure of the MOS transistor is formed, and a dielectric layer 48 is deposited on the n– well 44 and the p+ doping region 46 while the interlayer dielectric layer is formed on the MOS transistor region. A plurality of contact plugs 50 is also formed in the alignment mark region while the contacts of the MOS transistor is fabricated, in which the contact plugs 50 would be electrically connected to the p+ doping region 46 directly, thereby forming a top-down conductive structure. The alignment mark 40 is preferably formed on the scribe line of a wafer. However, the position of the alignment mark 40 could also be adjusted according to the demand of the fabrication process, such as formed in the corner of a die, which is also within the scope of the present invention.

It should also be noted that the shape of the alignment mark 40 is preferably determined by the position of the PN junction. For instance, the present invention could control the amount of n-type and p-type dopants being implanted in the substrate as well as the distributing region of the implanted dopants while forming the n– well 44 and the p+ doping region 46, thereby forming a PN junction of different shapes. Referring to FIGS. 2-5, FIGS. 2-5 illustrate a top view of the alignment mark 40 according to different fabrication processes. As shown in FIGS. 2-5, while the ion implant for the PN junction and the source/drain region is conducted, the present invention could control the location of the implanted dopants by adjusting the layout of the photomask, such that the alignment mark 40 would present a pattern with at least two axis, such as two rectangular patterns standing along the x-axis and the y-axis, or a pattern includes at least a right angle, such as a T-shaped alignment 52 shown in FIG. 2, a L-shaped alignment mark 54 shown in FIG. 3, or a cross-shaped alignment mark 56 shown in FIG. 4. Additionally, an alignment mark having a pattern surrounding the array of the contact plugs 50 is also revealed, such as the alignment mark 56 shown in FIG. 5.

After the alignment mark 40 is formed, an electrical defect inspection system and an optical defect inspection system could be used for inspecting the alignment mark 40 for same fabrication level or different fabrication level of the process. Preferably, the electrical defect inspection system includes an e-beam inspection apparatus and the optical defect inspection system includes an optical inspection apparatus provided by KLA-Tencor Corp.

While using an e-beam inspection apparatus to inspect the defect, the configuration of the alignment mark 40 is determined by using inspection equipment to sense the contrast between the contact plugs 50 and the dielectric layer 48. As a PN junction composed of an n– well 44 and a p+ doping region 46 is formed in the semiconductor substrate 42, the region inspected by electronic beam would reveal a bright state as a result of voltage contrast caused in the PN junction, thereby providing a more pronounced indication of the alignment mark 40 during the defect inspection process.

According to an embodiment of the present invention, a defect inspection could be conducted by utilizing the aforementioned alignment mark. For instance, after a wafer is provided, an alignment mark is fabricated by using the aforementioned process on the scribe line of the wafer. Next, a first defect inspection is conducted by using an optical defect inspection system to align the alignment mark for forming a reference point and generating a first defect map according to the coordinates of this reference point. Preferably, the optical defect inspection system utilized in this embodiment is an optical inspection apparatus provided by the KLA-Tencor Corp.

After the first defect inspection is conducted, a semiconductor fabrication process is conducted on the wafer, in which the fabrication process may be selected from etching process, lithography, CMP process, implantation process, cleaning process, material forming process or combination thereof. A second defect inspection is then conducted by using an electrical defect inspection system to align the aforementioned alignment mark for forming another reference point and generate a second defect map according to the coordinates of the reference point. The first defect map generated from the first defect inspection is then compared with the second defect map generated from the second defect inspection to determine corresponding defects for further analysis.

In other words, the first defect inspection and second defect inspection of the present invention preferably uses at least two types of defect inspection systems to align the alignment mark. As the two defect inspection both uses the same alignment mark to form reference point, the offset issue of the coordinates of same defect at different material layer is significantly improved. According to a preferred embodiment of the present invention, the defect inspection of the present invention is able to increase the overlap sensitivity to approximately one micron.

It should be also noted that the aforementioned embodiment specifically conducts an optical defect inspection prior to an electrical defect inspection. However, the order of performing which type of defect inspection could be adjusted according to the demand of the fabrication. For instance, the electrical defect inspection system could also be used to perform the first defect inspection, and the optical defect inspection is used thereafter to perform the second defect inspection, which are all within the scope of the present invention.

Overall, the present invention first uses ion implantation to form an n– well and a p+ doping region in a semiconductor substrate, and forming a dielectric layer on the n– well and the p+ doping region and a plurality of conductive plugs in the dielectric layer. The contact plugs preferably penetrates the dielectric layer to contact the p+ doping region directly thereby forming a top-down conductive alignment mark. As the shape of the alignment mark is determined by the distribution of the PN junction, the present invention could control the amount and relative location of n-type and p-type dopants implanted into the substrate while forming the n– well and the p+ doping region, thereby fabricating an alignment mark with desired shape.

According to an embodiment of the present invention, the aforementioned alignment mark could also be applied in a defect inspection process, in which a first defect inspection is performed by aligning the alignment mark on the wafer as a reference point and a second defect inspection is performed thereafter by using the same alignment mark to form another reference point. As the same alignment mark is used for forming the reference point of each defect inspection, alignment offset issue of the coordinates of same defect at different material layer is improved significantly.

Those skilled in the art will readily observe that numerous modifications and alterations of the device and method may be made while retaining the teachings of the invention.

What is claimed is:

1. A defect inspection method, comprising:
performing a first defect inspection by a first type defect inspection system by aligning to an alignment mark on a wafer as a reference point for the first defect inspection;
performing at least one fabrication process to the wafer; and performing a second defect inspection by a second type defect inspection system by aligning to the alignment mark on the wafer as a reference point for the second defect inspection.

2. The defect inspection method of claim 1, wherein the first inspection is optical and the second inspection is electrical.

3. The defect inspection method of claim 1, wherein the fabrication process is selected from etching process, lithography, CMP process, implantation process, cleaning process, material forming process or combination thereof.

4. The defect inspection method of claim 1, wherein the alignment mark comprises at least one right angle.

5. The defect inspection method of claim 1, wherein the alignment mark is a T-shaped alignment mark.

6. The defect inspection method of claim 1, wherein the alignment mark is a L-shaped alignment mark.

7. The defect inspection method of claim 1, wherein the alignment mark is a cross-shaped alignment mark.

8. The defect inspection method of claim 1, wherein the first defect inspection further comprises obtaining a first defect map.

9. The defect inspection method of claim 8, wherein the second defect inspection further comprises obtaining a second defect map.

10. The defect inspection method of claim 9, further comprising comparing the first defect map and the second defect map.

* * * * *